(12) United States Patent
Yu et al.

(10) Patent No.: US 7,307,004 B2
(45) Date of Patent: Dec. 11, 2007

(54) METHOD WITH MECHANICALLY STRAINED SILICON FOR ENHANCING SPEED OF INTEGRATED CIRCUITS OR DEVICES

(75) Inventors: Cheng-Ya Yu, Taipei (TW); Sun-Rong Jan, Taipei (TW); Shu-Tong Chang, Taipei (TW); Chee-Wee Liu, Taipei (TW)

(73) Assignee: National Taiwan University, Taipei (TW)

( * ) Notice: Subject to any disclaimer, the term of this patent is extended or adjusted under 35 U.S.C. 154(b) by 355 days.

(21) Appl. No.: 10/982,375

(22) Filed: Nov. 5, 2004

(65) Prior Publication Data

US 2006/0099772 A1 May 11, 2006

(51) Int. Cl.
*H01L 21/00* (2006.01)
(52) U.S. Cl. ...................... 438/455; 438/457
(58) Field of Classification Search ............... 438/455, 438/457
See application file for complete search history.

(56) References Cited

U.S. PATENT DOCUMENTS

| | | | | |
|---|---|---|---|---|
| 6,156,623 | A * | 12/2000 | Hendrix et al. | 438/457 |
| 6,514,835 | B1 * | 2/2003 | Hendrix et al. | 438/457 |
| 7,094,666 | B2 * | 8/2006 | Henley et al. | 438/457 |
| 2004/0177802 | A1 * | 9/2004 | Sprenger et al. | 117/54 |
| 2005/0002010 | A1 * | 1/2005 | Zaal et al. | 355/72 |
| 2005/0146247 | A1 * | 7/2005 | Fisher et al. | 310/334 |
| 2006/0024917 | A1 * | 2/2006 | Henley et al. | 438/455 |
| 2006/0099772 | A1 * | 5/2006 | Yu et al. | 438/455 |
| 2006/0160329 | A1 * | 7/2006 | Henley et al. | 438/457 |
| 2006/0273488 | A1 * | 12/2006 | Seki et al. | 264/293 |
| 2007/0037323 | A1 * | 2/2007 | Henley et al. | 438/149 |

OTHER PUBLICATIONS

"Silicon Piezoresistive Stress Sensors and Their Application in Electronic Pakaging" Jeffery C. Shuling et al, IEEE Sensors Journal, vol. 1, No. 1, pp. 14-30), Jun. 2001.*
Suhling et al.: "Silicon Piezoresistive Stress Sensors and Their Application In Electronic Packaging", IEEE Sensors Jornal, vol. 1, No. 1, Jun. 2001, pp. 14-30.

* cited by examiner

*Primary Examiner*—Laura M. Schillinger

(57) ABSTRACT

A method with a mechanically strained silicon for enhancing the speeds of integrated circuits or devices is disclosed. The method with a mechanically strained silicon for enhancing the speeds of integrated circuits or devices includes the following steps: (a) providing a substrate, (b) fixing the substrate, (c) applying a stress upon the substrate, and (d) inducing a strain in one of a device and a circuit by stressing the substrate.

12 Claims, 9 Drawing Sheets

The distance away from the center of the substrate (mm)

US 7,307,004 B2

METHOD WITH MECHANICALLY STRAINED SILICON FOR ENHANCING SPEED OF INTEGRATED CIRCUITS OR DEVICES

FIELD OF THE INVENTION

The present invention relates to a method for enhancing the speed of integrated circuits, and more particularly to a method with a mechanically strained silicon for enhancing the speed of integrated circuits or devices.

BACKGROUND OF THE INVENTION

In the field of the integrated circuit technology, the mobility of the electronic component is limited by the physical property of the carrier. In the prior art, it has disclosed that the strained silicon is applied on the metal oxide-semiconductor field-effect transistors (MOSFETs) in order to modify the physical property of the devices and increase the speed of MOSFETs. The silicon is typically formed on the relaxed silicon-germanium buffer layers. Because of the different lattice constants of silicon and germanium, wherein the lattice constant of germanium is 4% larger than that of silicon, the silicon would be strained by the tensile stress provided from the silicon-germanium buffer layers. The silicon-germanium buffer can be formed on the substrate of silicon-on-insulator (SOI) or on the traditional substrate of silicon. No matter the silicon-germanium buffer is formed on the substrate of SOI or on the traditional substrate of silicon, the speeds of P-type MOSFETs and N-type MOSFETs will be improved and increased.

If the strained silicon is directly formed on the traditional silicon wafer, the relaxed silicon-germanium buffer of the substrate has to be formed on the traditional silicon wafer first. Some defects would be performed due to the large difference between the lattice constant of the relaxed silicon-germanium buffer and that of silicon wafer. In order to minimize such kind of defects, the graded relaxed silicon-germanium buffer with increasing concentration of the germanium, where the thickness of the relaxed silicon-germanium buffer is around 0.5 to 2 μm, will be grown on silicon substrate first beneath the relaxed silicon-germanium buffer with a constant concentration of germanium, then the thin layer of the strained silicon layer is formed on the top of the buffer layer by the epitaxy growth. In all kinds of the methods applied for forming the blanket strained silicon in the prior art, the relaxed silicon-germanium buffer has to be formed on the substrate first. The steps of forming the relaxed silicon-germanium buffer on the substrate will induce the genereateon of the dislocation at the interface of the strained silicon layer and the silicon-germanium buffer, and the genereateon of the dislocation will decrease the quality of the strained silicon.

The mechanical method for providing the strain on the substrate is the four point bending method disclosed by Jeffery C. Shuling (as shown in Jeffery C. Shuling et al, IEEE Sensors Journal, Vol. 1, No. 1, pp. 14-30). The first step of the four point bending method is to fix the whole wafer with two points of the substrate, and then the strain on the wafer is induced by applying the stress with the other two points of the substrate. Generally speaking, the method is applied for the adjustment of the stress on the material of piezoresistance. Hitachi company in Japan and the research groups of MIT have used this method to process the strains of the components in the applications of MOSEFTs. Although the four point bending method is convenient and easy to be processed on the strained substrate, the strained substrate can't sustain the strain for a long time.

Therefore, the present invention provides a method for maintain the strained silicon layer for a long time, and the method with a mechanically strained silicon is capable of enhancing the speed of integrated circuits or devices so as to overcome the disadvantages of the prior art described above.

SUMMARY OF THE INVENTION

It is an aspect of the present invention to provide a method for enhancing the speed of integrated circuits or devices on the substrate. According to the present invention, the substrate is strained when it is applied by the stress. After the substrate is strained, the effective mass of the carrier on the silicon channel is decreased and carrier mobility of the channel increased. Therefore, due to the enhancement of the carrier mobility, the operating speed of the devices on the substrate is substantially increased.

In accordance with an aspect of the present invention, a method for providing a strain in the device with one of a device and circuit on the substrate is provided. The method includes the following steps: (a) providing a substrate, (b) fixing the substrate, (c) applying a stress upon the substrate, and (d) inducing a strain in one of a device and a circuit by stressing the substrate.

Preferably, the substrate is made of one selected from a group consisting of a silicon, polysilicon, amorphous silicon, silicon germanium, compound substrate containing the elements of groups III, IV, and V, plastics, and metal sheet.

Preferably, the substrate is one of a silicon-on-insulator (SOI) and a silicon-germanium-on-insulator (SGOI).

Preferably, the substrate is one selected from a group consisting of a substrate with a fabricated device, a substrate with a fabricated circuit, a substrate having a surface attached to a device, and a substrate having a surface attached to a circuit.

Preferably, the substrate is propped up by a transverse rod when the edge of the substrate is fixed, such that a tensile strain is mainly generated on a side propped up by the rod, and a compressive strain is mainly generated on the other side.

Preferably, at least two points on one side of the substrate are propped up by the rod when the edge of the substrate is fixed, such that two kinds of strain are formed on either side of the substrate.

Preferably, the substrate has one of a device and a circuit on either side of the substrate by one of an integrated fabrication and a glue.

Preferably, one of said device and said circuit is attached on said substrate by wafer bonding.

Preferably, the strain is one selected from a group consisting of a tensile strain, a compressive strain, and a combination thereof, and is provided on either side of the substrate.

Preferably, the method is employed by a set of mechanical modules.

Preferably, the mechanical modules include a device for clipping and hooking and a movable shaft device.

Preferably, a coagulative fluid which is melt at high temperature is injected into the mechanical modules, and then the strained substrate is fixed by the coagulated solid at room temperature.

It is another aspect of the present invention to provide a method with a mechanically strained silicon for enhancing a speed of one of an integrated circuit and a devices thereof. The method includes the following steps: (a) providing a first substrate, (b) forming plural holes on a surface of the first substrate, (c) filling the plural holes of the first substrate with a volume-changeable substance, (d) providing a second plane, (e) covering the second substrate onto the first substrate, (f) changing a volume of the substance, and (g) inducing a strain on the second substrate by the volume-changed substance.

Preferably, the volume changed in the step (f) is achieved by one of providing different thermal expansion coefficients between the volume changeable substance and substrate and performing a chemical reaction within the substrate.

Preferably, one of a device and a circuit is formed on the second substrate by one of an integrated formation and an attachment.

Preferably, the second substrate is one of a silicon-on-insulator (SOI) and a silicon-germanium-on-insulator (SGOI).

Preferably, an integrated circuit component and a photoelectrical component are formed on the second substrate before binding the first substrate and the second substrate.

Preferably, a surface of the second substrate is flattened for fabricating the integrated circuit and the photoelectrical component thereon after the strain is formed on the second substrate.

Preferably, the strain is one selected from a group of a tensile strain, a compressive strain, and a combination thereof.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The invention will now be described more specifically with reference to the following embodiments. It is to be noted that the following descriptions of preferred embodiments of this invention are presented herein for the purpose of illustration and description only; it is not intended to be, exhaustive or to be limited to the precise form disclosed.

The present invention provides a method for providing a mechanical stress on the substrate to bend the substrate and form a strained substrate. Once the substrate is strained by the stress, the effective masses of the electrons on the strained channel and those of the holes on the strained channel are decreased, and the mobility of the electrons on the strained channel and those of the holes on the strained channel are increased. After the physical property of the strained substrate has modified into a better situation, the operation speed of the devices on the strained substrate increase due to the increasing mobility of the electrons on the strained channel and those of the holes on the strained channel. Therefore, the properties of the electronic devices on the strained substrate, such as MOSFETs, are improved and the mobility of the electronic devices on the strained substrate are increased.

Figure 1A:
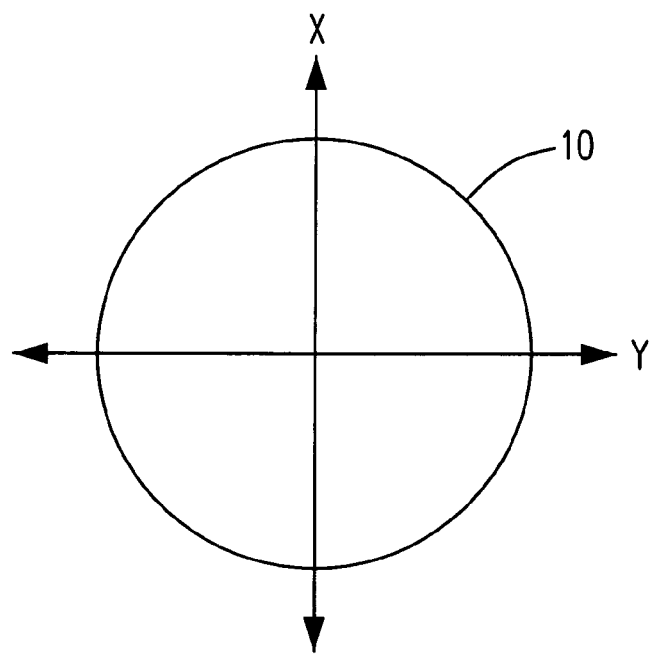
FIGS. 1(a), 1(b), and 1(c) are the schematical views showing the substrate strained by a stress according to the preferred embodiment of the present invention.
Figure 1B:
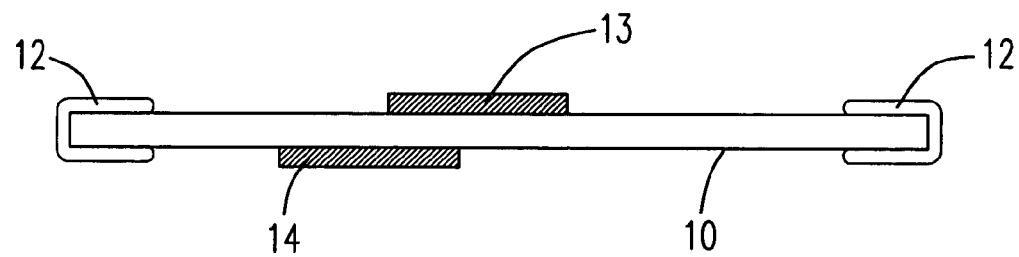
Figure 1C:
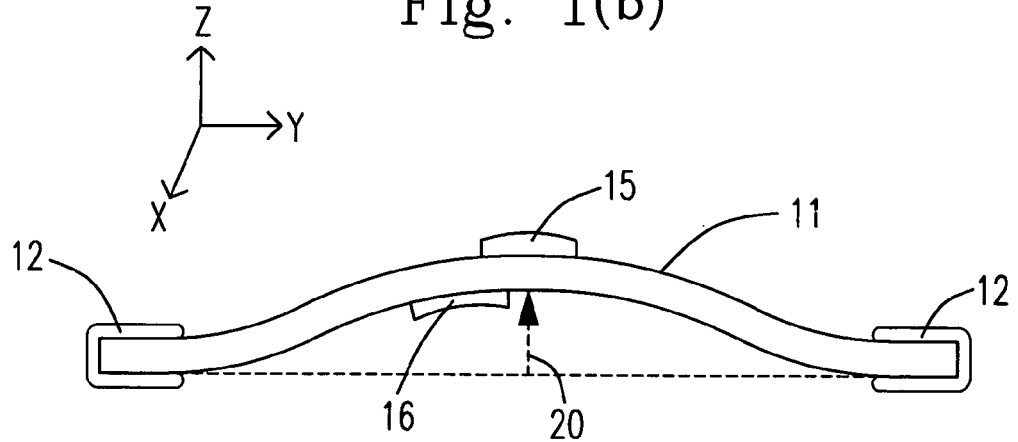

Please refer to FIGS. 1(a) to 1(c) which show are the basic embodiment of the present invention. FIG. 1(a) is a top view of the round substrate 10. There are devices/integrated circuits 13, 14, 15, and 16 attached to the substrate or fabricated on either side of the round substrate 10. The edge of the round substrate 10 is fixed by the clipping devices 12 as shown in FIG. 1(b). When the round substrate 10 is applied by a upward mechanical stress 20, the round substrate 10 would be bended as the strained substrate 11 as shown in FIG. 1(c). The devices/integrated circuits 13 and 15 on the top of the round substrate 10 is under a tensile strain, and the devices/integrated circuits 14 and 16 on the bottom of the round substrate 10 is under a compressive strain.

Figure 2A:
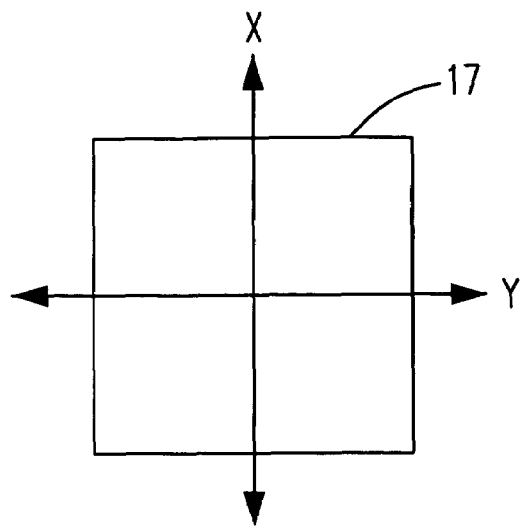
FIGS. 2(a), 2(b), and 2(c) are the schematical views showing the substrate strained by a stress according to the preferred embodiment of the present invention.
Figure 2B:
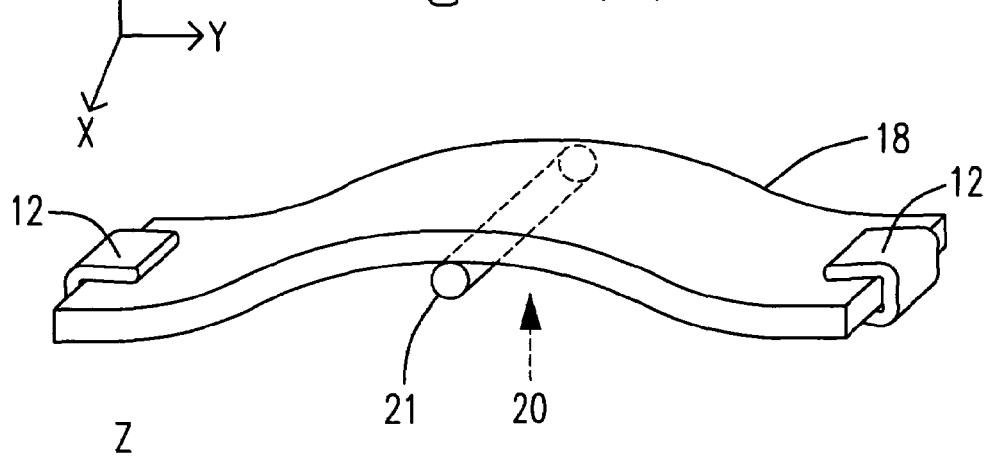
Figure 2C:
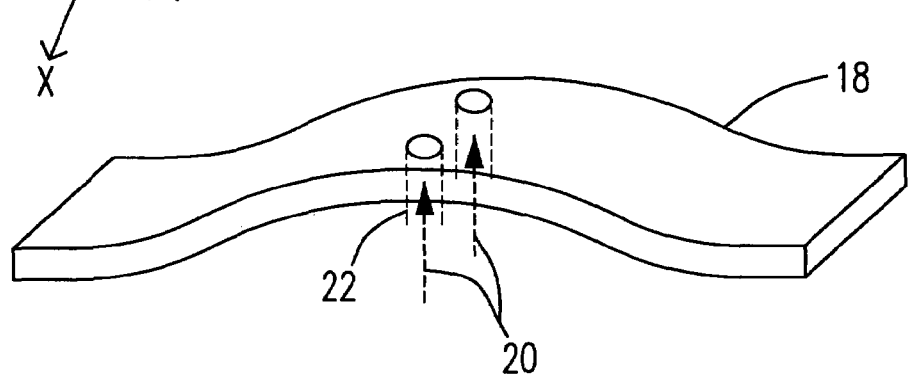

The method of applying the stress on the square substrate 17 and the strain on the square substrate induced thereby could be found in FIGS. 2. Please refer to FIGS. 2(a) to 2(c), which illustrate the examples of the square substrate 17 and the strained square substrate 18. FIG. 2(a) is a top view of the square substrate 17. Before the square substrate 18 is stressed, the clipping devices 12 are applied to fix the edge of the square substrate 17 first. When the edge of the square substrate 17 is fixed, the square substrate 17 is pressed by a upward mechanical stress 20 from the symmetrical axis of the square substrate 17 in order to induce the symmetrical strain on the square substrate 17. The symmetrical strain is obtained after the square substrate 17 is pressed by the mechanical stress 20. A simpler and easier embodiment of providing a mechanical stress on the symmetrical axis of the square substrate is shown in FIG. 2(b). The first step of the method is to put a transverse rod 21 under the bottom of the square substrate 17, wherein the transverse rod 21 is along the direction of the symmetrical axis of the square substrate 17. Then the transverse rod 21 is raised up to the square substrate 17 to provide the mechanical stress 20 on the square substrate 17. After the mechanical stress 20 is applied on the square substrate 17, it is bended and became the strained square substrate 18. Another method for forming the strained square substrate is illustrated in FIG. 2(c). Several vertical supporting rods 22 are put equally under the bottom of the square substrate 17, wherein the vertical supporting rods 22 are along the symmetrical axis of the square substrate 17. Each distance between the adjacent supporting rods is the same. Two adjacent vertical supporting rods 22 are taken as a sample and shown in FIG. 2(c). The even and equal stresses are applied from various vertical supporting rods 22, and the square substrate 17 is pressed by the sum of the mechanical stresses 20, which are from the whole vertical supporting rods 22. After that, the square substrate 17 is bended as the strained square substrate 18 by the sum of the mechanical stresses 20.

Figure 3A:
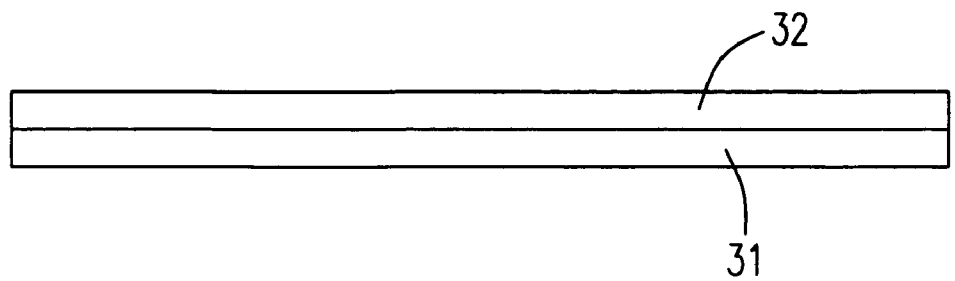
FIGS. 3(a) and 3(b) are the schematical views showing the complex substrate strained by a stress according to the preferred embodiment of the present invention.
Figure 3B:
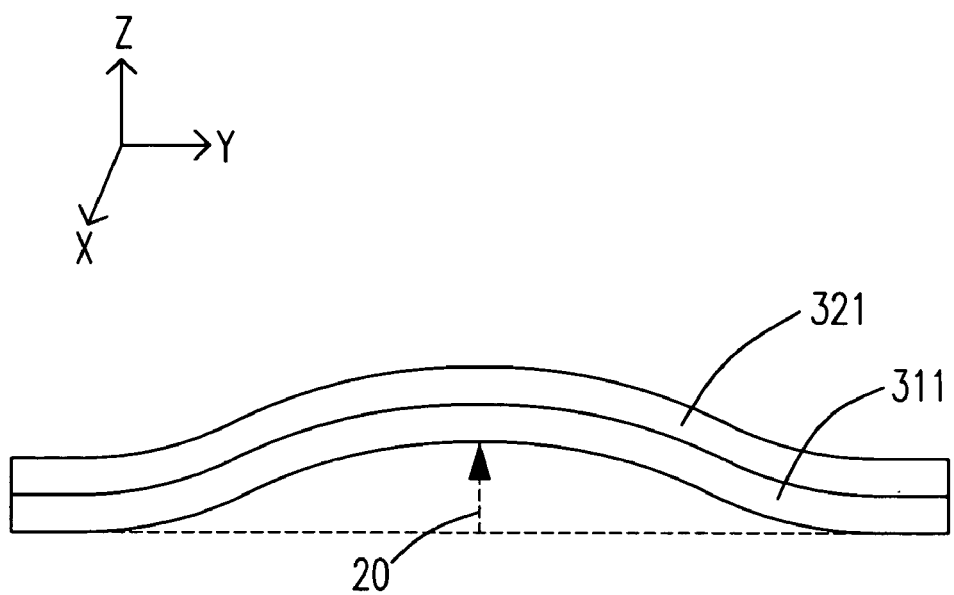

The substrate could be the substrate whose surface has not been processed, the semiconductor substrate whose surface has been processed for the integrated circuits already, or the complex substrates formed by the substrates 31 and 32 in FIGS. 3(a) and 3(b). In addition, the substrates 31 and 32 could be processed by the method of a mechanical grind, an chemical etching or a smart-cut in order to control the thickness of the substrates 31 and 32 when the substrates are bound or bonded with other substrate or when the substrates 31 and 32 are still not be strained. The strained substrates 311 and 321 would be formed by the substrates 31 and 32 after the mechanical stress 20 is applied.

Figure 4A:
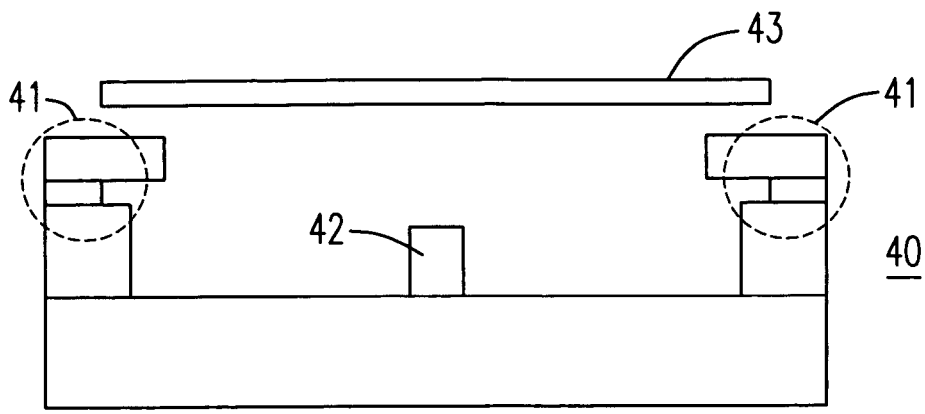
FIGS. 4(a), 4(b) and 4(c) are the schematical views showing the module for providing a stress according to the preferred embodiment of the present invention.
Figure 4B:
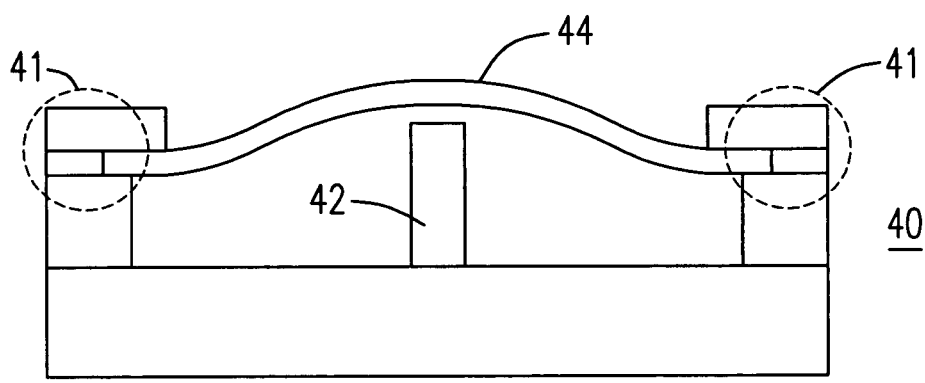
Figure 4C:
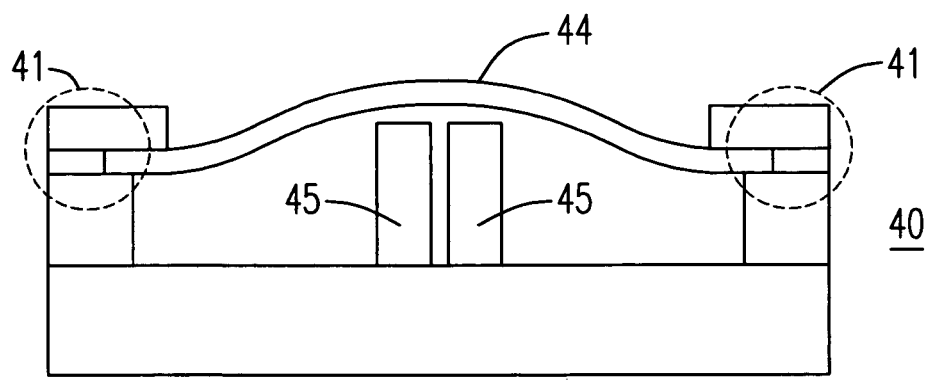

Except the above methods of applying the stress for the strain on the substrate, there are some other methods to achieve this goal, such as the specific mechanical modules or appliances to induce the substrate strained. When the specific mechanical module in the present invention is applied to strain the substrate, the steps of the method are simplified. Such result is shown in FIGS. 4(a) to 4(c), the mechanical module 40 for providing the mechanical stress contains the clipping devices 41 and the movable shaft device 42. The mechanical module 40 is suitable for the substrates with various shapes when the substrate 43 (FIG. 4(a)) could be fixed on the mechanical module 40 by the clipping devices 41, wherein the clipping devices 41 are on the two sides of the mechanical module 40. When the substrate 43 is fixed on the mechanical module 40, the movable shaft 42 raises the substrate 43 from the bottom of the substrate 43 and applies the stress on the substrate 43. Accordingly, and the substrate 43 is strained as the strained substrate 44 shown in FIG. 4 (b). The device with one movable shaft 42 is shown in FIG. 4(b), and the device with multiple symmetrical movable shafts 45 is shown in FIG. 4(c). Please refer to FIGS. 4(a) to 4(c), the mechanical module 40 provides the symmetrical stress on the substrates 43 and the symmetrically strained substrates 44 are formed accordingly.

Figure 5A:
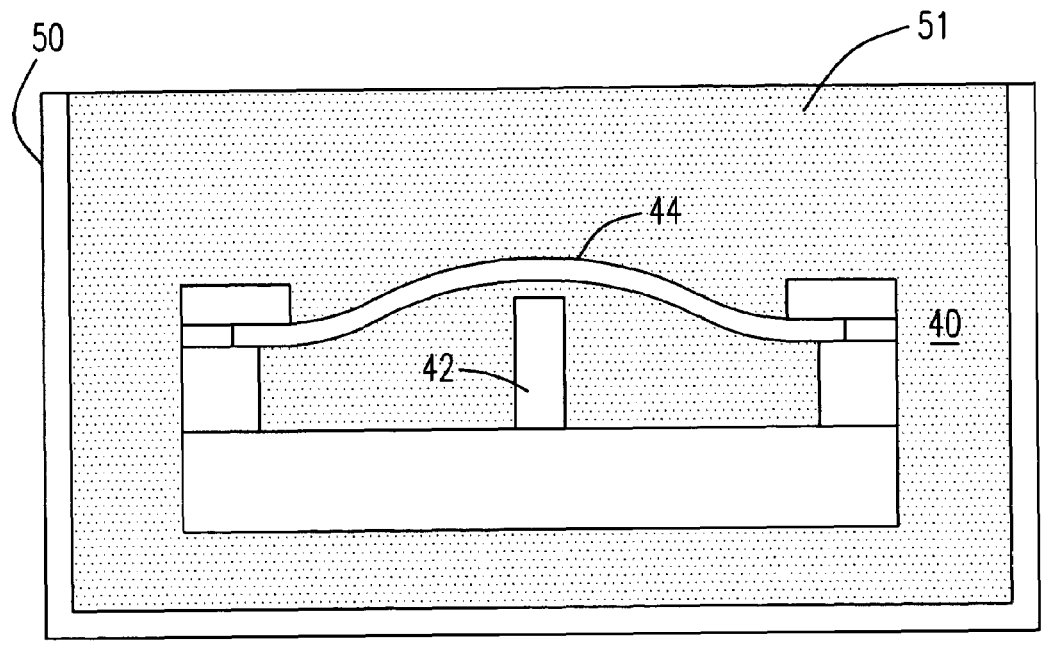
FIGS. 5(a) and 5(b) are the schematical views showing the strained substrate contained in the coagulative fluid according to the preferred embodiment of the present invention.
Figure 5B:
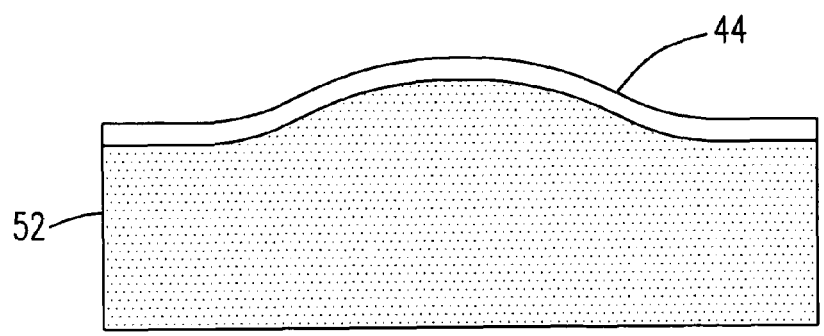

After the substrate is strained by the mechanical stress, it needs to maintain the substrate in the strained situation for a long time in order to improve the increasing speeds of integrated circuits on the strained substrate in a long-term period. For this reason, the strained substrate 44, the movable shaft device 42 and the mechanical module 40 are put into the tank 50 full of the coagulative fluid 51. FIG. 5(a) is a view showing the strained substrate 44 and the mechanical module 40 in the tank 50. After the strained substrate 44 is coagulated by the coagulative fluid 51 in the tank 50, the strained substrate 44 is separated from the mechanical module 40, and the situation is shown in FIG. 5(b). After the separation of the strained substrate 44 and the mechanical module 40, the source of the mechanical stress for the strained substrate 44 is transferred from the mechanical module 40 to the coagulated solid 52. The mechanical stress provided from the coagulated solid 52 is kept applying on the strained substrate 44 to maintain the strain. When the mechanical module 40 has been separated from the strained substrate 44, the module 40 for providing the mechanical stress to the substrate can be repeatedly used for several times. The benefit of the repeatable mechanical module 40 is capable of decreasing the, cost for processing the strained substrate and being helpful on the assembling process of the semiconductor industry.

Figure 6A:
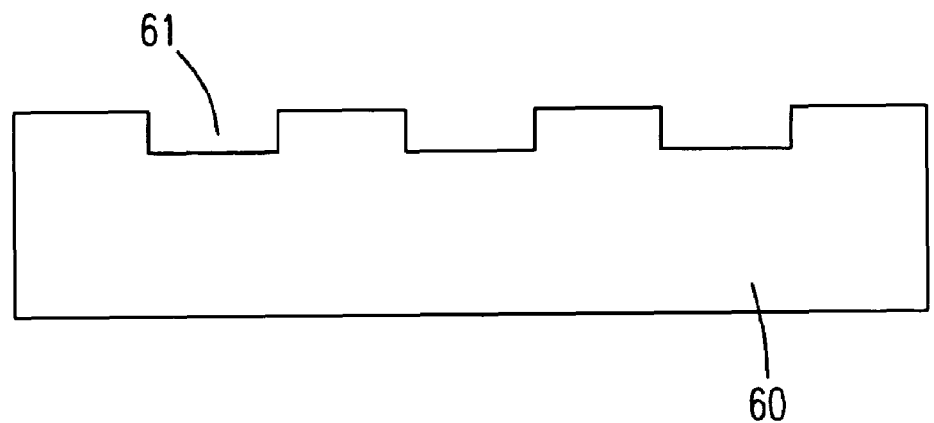
FIGS. 6(a), 6(b), 6(c) and 6(d) are the schematical views showing the method of applying a strain to the substrate by changing the volume of the volume-changeable substance in the tank according to the preferred embodiment of the present invention.
Figure 6B:
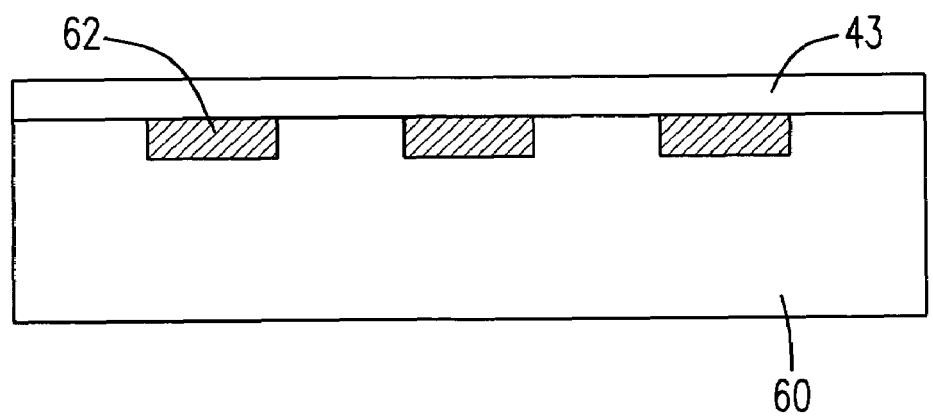
Figure 6C:
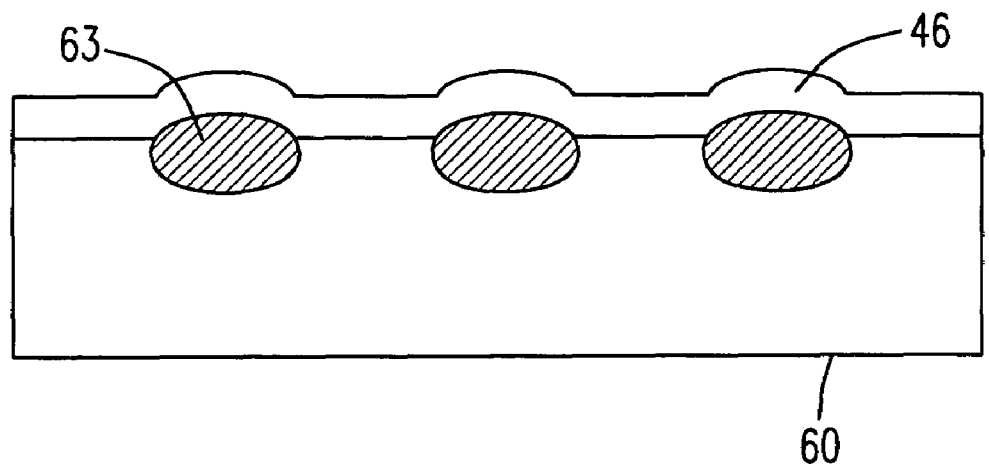
Figure 6D:
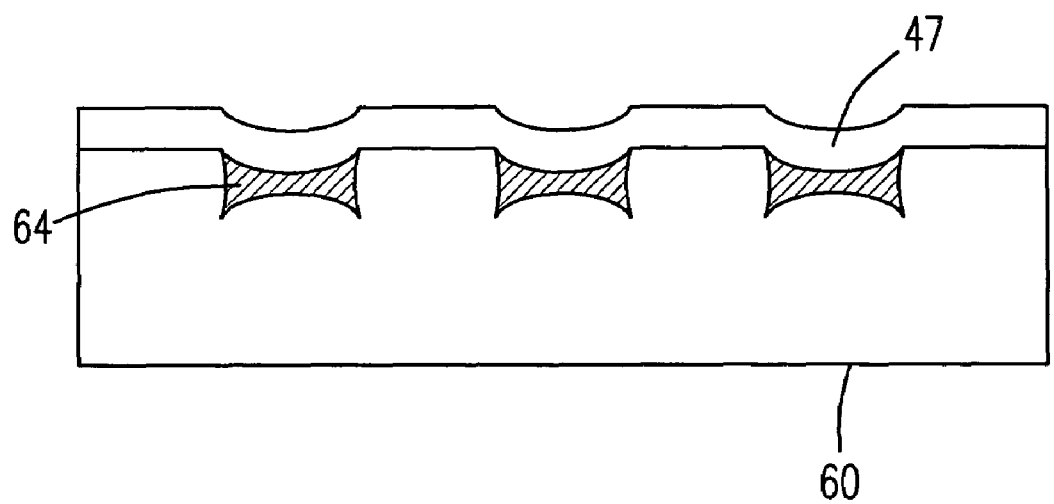

In addition, FIGS. 6(a) to 6(d) provide another method for applying the mechanical stress on the substrate. Please refer to FIG. 6(a), there are several fillisters 61 made on the top of the module 60. Please refer to FIG. 6(b), after the volume-changeable substance 62 is filled into the fillisters 61 of the module 60, the substrate 43 is covered on the module 60 in order to seal the fillisters 61. The methods for connecting the substrate 43 with the module 60 tightly so as to seal the fillisters 61 of the module 60 could be performed by binding or bonding. After the fillisters 61 are sealed, the volume of volume-changeable substance 62 is changed by changing the temperature or changing the pressure. If the volume-changeable substance 62 becomes the swelling substance 63, as shown in FIG. 6(c), the swelling substance 63 is applied to provide the tensile stress on the substance 43, and the substrate 43 becomes the strained substrate 46 due to the tensile stress provided by the swelling substance 63. If the volume-changeable substance 62 becomes the condensing substance 64, the condensing substance 64 provides the compressive stress on the substrate 43, and the substrate 43 becomes the strained substrate 47 due to the compressive stress provided by the condensing substance 63. No matter what kind of the strained substrate is, such as the strained substrate 46 caused by the tensile stress or the strained substrate 47 caused by the compressive stress, the flattening process for the surface of the strained substrate could be performed by the grind method or the etching method.

Figure 7:
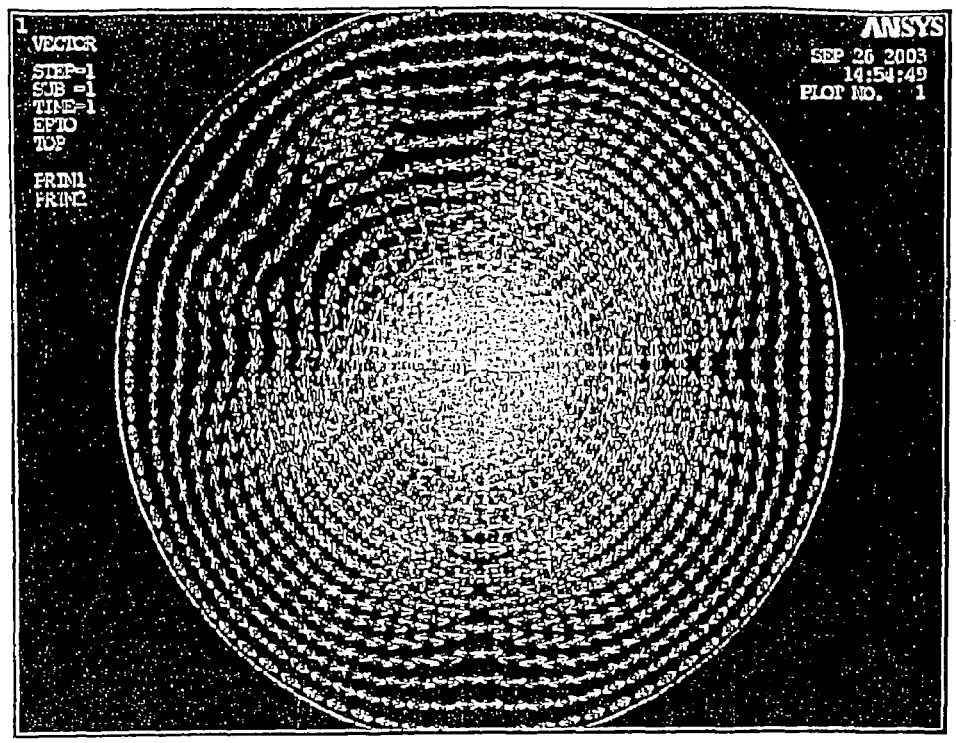
FIG. 7 is an analysis graph of the strained substrate obtained by analyzing the strain thereof with a simulation software.
Figure 7:
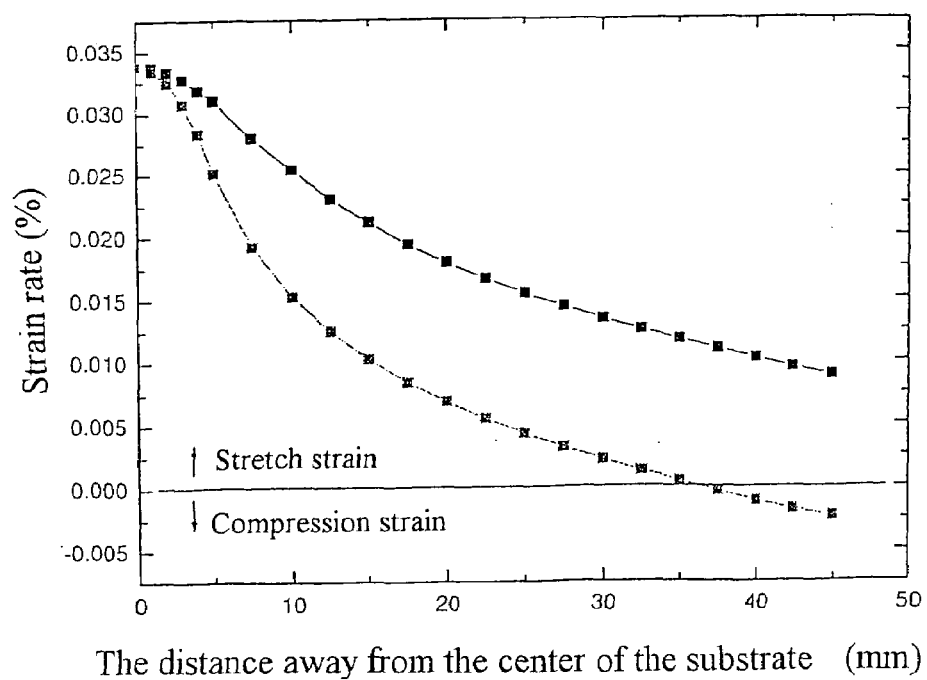
Figure 8:
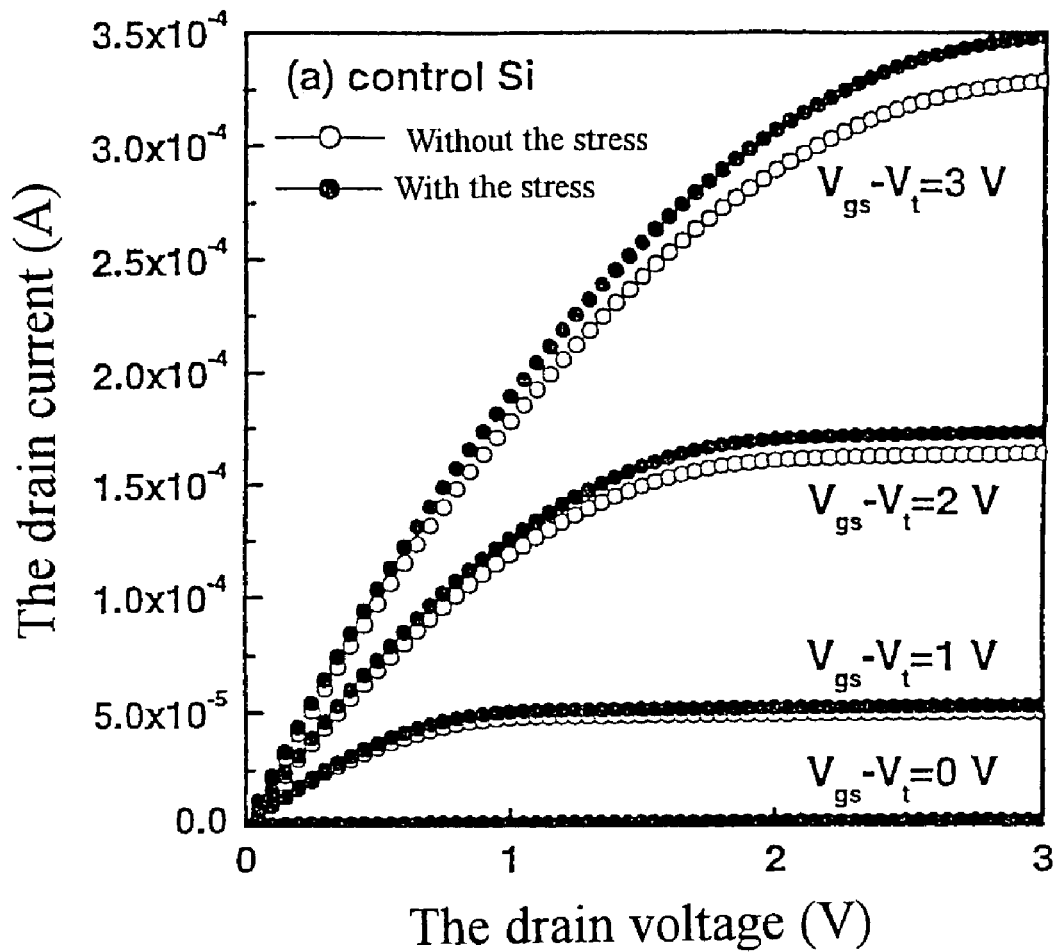
FIG. 8 is a graph illustrating the relationships between the drain currents and the drain voltages of the transistors on the unstrained substrate and on the strained substrate.

In order to understand the effect of the strained substrate clearly, the simulation software is applied to analyze the speed of the strained substrate. The increasing operation speed of the devices on the strained substrate is proved by the experiment. FIG. 7 is an analysis graph of the strained substrate when the additional stress is applied on it, and the graph is analyzed by the simulation software named "ANSYS". The analysis graph shows the strain distributions on the substrate when it is pressed by the mechanical stress. According to the graph, it's known that when the stress is closer to the center of the substrate, the strain of the substrate is larger. FIG. 8 is a graph illustrating the relationship between the drain currents and the drain voltages on the transistors of the strained substrate made by the method in the present invention. After the substrate is strained, no matter what the value of the gate voltage is, the drain current of the strained substrate is increased when it is compared to the drain current measured on the unstrained substrate. In FIG. 8, the drain current of the strained substrate is increased by 6.5%.

In conclusion, the present invention provides a method with a mechanically strained silicon for enhancing the speeds of integrated circuits or devices, and the efficiency of the devices on the substrate will increase indeed. In addition, it is possible that the drain current would be increased when a optimal experiment is provided.

While the invention has been described in terms of what is presently considered to be the most practical and preferred embodiment, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for providing a substrate strained and connected to one of a device and a circuit, comprising:

(a) providing a substrate;
(b) fixing said substrate;

(c) applying a stress upon said substrate; and (d) inducing a strain in the one of the device and the circuit by injecting a coagulative fluid melt at relatively high temperature and solidified at a room temperature to said substrate strained for maintaining the stress upon said substrate.

2. The method as claimed in claim 1, wherein said substrate is made of one selected from a group consisting of a silicon, polysilicon, amorphous silicon, silicon germanium, compound substrate containing the elements of groups III, IV, and V, plastics, and metal sheet.

3. The method as claimed in claim 1, wherein said substrate is one of a silicon-on-insulator (SOI) and a silicon-germanium-on-insulator (SGOI).

4. The method as claimed in claim 1, wherein said substrate is one selected from a group consisting of a substrate with a fabricated device, a substrate with a fabricated circuit, a substrate having a surface attached to a device, and a substrate having a surface attached to a circuit.

5. The method as claimed in claim 1, wherein said substrate is propped up by a transverse rod when said edge of said substrate is fixed, such that a tensile strain is mainly generated on a side propped up by said rod, and a compressive strain is mainly generated on the other side.

6. The method as claimed in claim 1, wherein at least two points on one side of said substrate are propped up by said rod when said edge of said substrate is fixed, such that two kinds of strain are formed on either side of said substrate.

7. The method as claimed in claim 1, wherein said substrate has one of a device and a circuit on either side of said substrate by one of an integrated fabrication and a glue.

8. The method as claimed in claim 7, wherein one of said device and said circuit is attached on said substrate by wafer bonding.

9. The method as claimed in claim 1, wherein said strain is one selected from a group consisting of a tensile strain, a compressive strain, and a combination thereof, and is provided on either side of said substrate.

10. The method as claimed in claim 1 employed by a set of mechanical modules.

11. The method as claimed in claim 10, wherein said mechanical modules comprise a device for clipping and hooking and a movable shaft device.

12. The method as claimed in claim 11, wherein said coagulative fluid which is melt at the high temperature is injected into said mechanical modules, and then said substrate is fixed by said coagulated solid at the room the temperature.

* * * * *